(12) United States Patent
Elian

(10) Patent No.: US 9,601,858 B2
(45) Date of Patent: Mar. 21, 2017

(54) MAGNET PACKAGE AND METHOD FOR PRODUCING A MAGNET PACKAGE

(71) Applicant: Infineon Technologies AG, Neubiberg (DE)

(72) Inventor: Klaus Elian, Alteglofsheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/590,017

(22) Filed: Jan. 6, 2015

(65) Prior Publication Data

US 2015/0194249 A1    Jul. 9, 2015

(30) Foreign Application Priority Data

Jan. 7, 2014   (DE) .................. 10 2014 100 119

(51) Int. Cl.
| | | |
|---|---|---|
| *H01R 11/30* | (2006.01) | |
| *H01R 13/405* | (2006.01) | |
| *H01R 13/62* | (2006.01) | |
| *H01R 13/66* | (2006.01) | |
| *H01F 1/08* | (2006.01) | |
| *H01F 1/113* | (2006.01) | |
| *H01F 41/02* | (2006.01) | |

(52) U.S. Cl.
CPC ........... *H01R 13/405* (2013.01); *H01F 1/083* (2013.01); *H01F 1/113* (2013.01); *H01F 41/0266* (2013.01); *H01R 13/6205* (2013.01); *H01R 13/6683* (2013.01)

(58) Field of Classification Search
CPC .. H01R 13/405; H01R 13/6205; H01R 11/30; H01R 13/6683; H01F 1/04; H01F 7/02

USPC .......... 439/38, 39, 40, 305, 607.02
See application file for complete search history.

(56) References Cited

U.S. PATENT DOCUMENTS

| | | | |
|---|---|---|---|
| 4,188,605 A | 2/1980 | Stout | |
| 4,500,881 A * | 2/1985 | Beane ................. | H04B 5/0093 340/13.26 |
| 6,174,203 B1 * | 1/2001 | Asao .................. | H01R 13/7195 439/38 |
| 6,309,227 B1 * | 10/2001 | Chen .................... | H01R 12/57 439/607.02 |
| 8,460,007 B1 * | 6/2013 | Xie .................... | H01R 13/6205 439/289 |
| 8,569,917 B2 * | 10/2013 | Tang ..................... | H02K 5/148 310/68 B |
| 8,727,326 B2 * | 5/2014 | Lin ........................ | B25B 11/02 269/8 |
| 2002/0039667 A1 * | 4/2002 | Takaya ................. | H01B 3/004 428/824 |
| 2002/0164892 A1 * | 11/2002 | Girbachi ............... | H01F 17/04 439/38 |

(Continued)

FOREIGN PATENT DOCUMENTS

| | | |
|---|---|---|
| CN | 103090890 A | 5/2013 |
| WO | 2013142112 A1 | 9/2013 |

OTHER PUBLICATIONS

Courtesy examination report issued from counter-part DE application 10 2014 100 119.2.

*Primary Examiner* — Abdullah Riyami
*Assistant Examiner* — Nelson R Burgos-Guntin

(57) ABSTRACT

A magnet package is created, which includes a package body, wherein the package body is formed of a permanent magnetic material, and at least one electric contact, which is covered by the package body.

17 Claims, 2 Drawing Sheets

(56) References Cited

U.S. PATENT DOCUMENTS

| | | | | |
|---|---|---|---|---|
| 2003/0148636 A1* | 8/2003 | Henry | G01D 11/24 | 439/10 |
| 2004/0157506 A1* | 8/2004 | Kondo | H02S 40/32 | 439/894 |
| 2006/0019551 A1* | 1/2006 | Jamnia | B29C 45/1671 | 439/736 |
| 2006/0207871 A1* | 9/2006 | Yumshtyk | C23C 14/35 | 204/192.1 |
| 2007/0141860 A1* | 6/2007 | Hernandez | H01F 38/14 | 439/38 |
| 2007/0157428 A1* | 7/2007 | Kim | G05G 9/047 | 16/221 |
| 2007/0184674 A1* | 8/2007 | Koch | H01H 51/2209 | 439/39 |
| 2008/0202241 A1* | 8/2008 | Phan Le | G01D 5/145 | 73/514.31 |
| 2009/0140725 A1* | 6/2009 | Ausserlechner | G01R 33/072 | 324/207.2 |
| 2010/0233889 A1* | 9/2010 | Kiani | H01R 13/7037 | 439/39 |
| 2010/0295140 A1* | 11/2010 | Theuss | B82Y 25/00 | 257/421 |
| 2013/0106562 A1 | 5/2013 | Shafer et al. | | |
| 2013/0113474 A1 | 5/2013 | Elian | | |
| 2013/0239404 A1* | 9/2013 | Ahrens | H01L 23/5227 | 29/607 |
| 2014/0085907 A1* | 3/2014 | Jun | G09G 3/3208 | 362/362 |
| 2014/0187057 A1* | 7/2014 | Murtagian | H01R 13/6205 | 439/39 |
| 2015/0118868 A1* | 4/2015 | Choi | H01R 11/30 | 439/39 |
| 2015/0188400 A1* | 7/2015 | Kemp | H02K 53/00 | 310/74 |
| 2015/0194249 A1* | 7/2015 | Elian | H01R 13/6205 | 439/39 |
| 2015/0311619 A1* | 10/2015 | Kato | H01R 13/6594 | 439/137 |

* cited by examiner

MAGNET PACKAGE AND METHOD FOR PRODUCING A MAGNET PACKAGE

Various exemplary embodiments generally relate to a method for producing a magnet package, and a magnet package, in particular, for a connector.

In many areas of technology, housing or packages are used for components or modules. An example of such packages is a connector, in which electrical terminals are encapsulated by a housing or package to allow the connector to be handled or plugged in. Such connectors are used in all fields of technology in which electric currents or signals are transmitted. For example, many different sensors that must be electrically contacted are used in today's vehicle construction. Cable harnesses including or providing a large number of such connectors are usually used for this purpose.

Various exemplary embodiments provide a magnet package, which comprises a package body, formed of a permanent magnetic material, and at least one electric contact covered by the package body.

Various exemplary embodiments provide a connector, which comprises a housing element formed of a permanent magnetic material, and at least one electrically conductive terminal contact that is at least partially encapsulated by the housing element.

Various exemplary embodiments provide a method of manufacturing a magnet package, wherein the method comprises a providing of at least one electrically conductive structure; and a partially encapsulating of the electrically conductive structure by a permanent magnetic material.

Specific exemplary embodiments of the magnetic core, the connector and the method of manufacturing a magnetic core are described in the following.

The configurations of the specific exemplary embodiments can also be combined with each other.

In particular, the at least one electric contact may be formed as an elastic spring contact. By using such an electric contact it may be possible that the magnet package and possibly optionally electrical or electronic parts or components arranged therein may be contacted. The term "elastic spring contact" may be understood, in particular, as a contact which exerts or generates a resetting force upon deflection from a rest position. Such elastic spring contacts are widely used, e.g. in connectors.

In particular, the electric contact may be formed of a mechanically stable material, for example a copper alloy, steel or a similar material. Alternatively, mechanically stable electrically conductive plastics may also be used. The term "electric contact" may particularly denote an interface or a terminal that has an electrical conductivity above a preset limit. This limit may particularly depend on the intended use of the magnet package. At the same time, the package or the housing may also be used as a back-bias magnet. Note that the package may assume or have any desired shape.

The term "package body" may particularly denote an element which forms a main body of a housing, e.g. housing of a connector. Such a package body may be formed, in particular, using a solid or a hollow body, wherein the material of the body itself shows permanent magnetic properties. In particular, it may exhibit ferromagnetic properties, or comprise a material having such ferromagnetic properties. Thus, the body or a material of the body may itself already be permanently magnetic. A package or a housing comprises a permanent magnet separated from the housing material or the package material, is therefore to be distinguished from a package body formed of a permanent magnetic material. In particular, the distinction may be given by the fact that a permanent magnetic material is arranged in a finely dispersed manner in the package body according to an exemplary embodiment. In particular, the use of the package body itself as an extra permanent magnet in the package or housing may have the advantage over the conventional arrangement that this allows a simple and efficient way formation of large-scale magnets which allow for more effective shaping or forming of a magnetic field than would be possible by a separate small permanent magnet arranged separately in a package. In other words, it might be said that an idea of an exemplary embodiment may be seen in the fact that a package is created, which comprises magnetic materials in its housing, in particular, in the housing material itself. In particular, the magnet package may comprise a thread or thread structures and/or a groove. The thread may be used to attach the magnet package to another element, while the groove may be used to accommodate seals, e.g. sealing rings.

In particular, the electrically conductive structure may be a carrier or a leadframe. By encapsulating a housing or a housing element may be formed, which, at the same time, provides a magnetic field. Preferably, a portion or section of the electrically conductive structure is free of the encapsulation, i.e. it is not encapsulated, and forms an electric contact. By providing a magnetic housing or a magnetic encapsulation it may be possible to spare additional housing elements on further use of the magnet package or connector. Such additional housing elements are typically used after attaching a magnet around the arrangement.

According to an exemplary embodiment of the magnet package the magnet package is formed as a connector.

In that case, the at least one electric contact may be formed as a plug contact, by which the magnet package may be electrically connected to another component, element, or a further device. For example, the connector may be used as part of a cable or a cable harness. In particular, a connector may be formed, which already comprises a magnetic field by its housing, without any additional components arranged in the housing.

According to an exemplary embodiment of the magnet package, the package body comprises at least one surface structure which is suitable to be used as an alignment feature.

In particular, the package body may comprise a plurality of surface structures. For example, the surface structures may be formed as grooves or adjusting grooves, lugs, projections, rills, notches, threads, back-cuts, undercuts, or similar. In particular, the surface structure may permit alignment of the magnet package to an external device or component.

According to an exemplary embodiment of the magnet package, a magnetic field-shaping region is formed in the package body.

By using a field-shaping region or element, it may be possible to shape a magnetic field, which is generated by the permanent magnetic material of the package, housing or encapsulation, or to influence the course of the magnetic field. In particular, the field-shaping region may be formed by the inclusion of another material in the field-shaping region, which is different from the permanent magnetic material of the package body. In particular, the magnetic properties of the other material and the permanent magnet material may differ.

According to an exemplary embodiment of the magnet package, the field-shaping region is formed by a cavity and/or another material.

In particular, a hollow space or a void area having a predetermined shape may be formed in the package body. In this case, air or gas filled in the cavity may be viewed as another material forming the field-shaping region.

According to an exemplary embodiment of the magnet package, the magnet package also comprises a chip.

In particular, the chip may be an IC chip, semiconductor chip or sensor chip or form part of a sensor. Another part of the sensor may be formed by the magnet package, which may, for example, form a magnetic component of the sensor. In particular, the sensor chip may form a sensor or be a part of such a sensor configured to measure a magnetic field or its measurement is based on a magnetic field. Thus, the magnet package may already comprises a sensor as well as a magnetic field, so as to allow a very compact design of the magnetic sensors.

According to an exemplary embodiment of the magnet package, the electric contact is formed by a leadframe.

In particular, the leadframe may be bent. For example, the leadframe may be bent to render a U or V-shape and form two electrical terminals or contacts which form the connections or plug contacts of a connector.

According to an exemplary embodiment of the magnet package, the magnetic material may comprise a carrier component and a magnetic component.

The term "carrier component" may particularly denote that the corresponding component or the corresponding material is the main component from which the package body, such as a connector body is formed. Here, main component may mean, in particular, that the corresponding component has a proportion by weight of more than 50%, in particular, more than 70%.

In particular, the magnetic component may be in the form of particles or flakes of a permanent magnetic material. Alternatively, the carrier component may itself have magnetic properties. In case a magnetic carrier material, for example a magnetic plastic, is used, the magnetic component may optionally be omitted.

According to an exemplary embodiment of the magnet package, the magnetic component comprises at least one substance selected from the group of substances which consist of:

samarium, cobalt, iron, neodymium, SmCo, NdFeB, ferrite, hard ferrite, and compounds thereof.

According to an exemplary embodiment of the magnet package, the carrier component is a substance selected from the group consisting of: thermoplastics (Thermoplaste), thermosets (Duroplaste) and elastomers (Elastome).

Examples of this may be, in particular, polyamide, polyphenylene sulfide (PPS) or other known high-performance plastics, for example with a heat deflection temperature of greater than 100° C., in particular, greater than 150° C. and/or with good electrical insulation properties.

According to an exemplary embodiment of the magnet package, the magnetic material is configured such that a magnetic field strength within the package body has a gradient.

In particular, such a gradient, i.e. a different magnetic field strength along an extended space around the package body may be generated by a different weight proportion or concentration of a magnetic component. For example, a higher proportion of a magnetic component may be present in a first region of the package body, whereas a lower proportion of a magnetic component may be present in a second section. Such a difference may be gradual, continuous or stepwise. As an alternate to a change in this proportion, the magnetization of the magnetic component may also be varied.

Alternately, the magnetic field generated by the permanent magnetic material of the package body may also be homogeneous or substantially homogeneous. In particular, along one dimension the magnetic field within the package body may therefore be constant.

According to an exemplary embodiment of the magnet package, the at least one electric contact is mechanically stable.

In particular, the material of the electric contact may be an elastically resilient material, e.g. a copper alloy or steel.

According to an exemplary embodiment of the connector, the electrically conductive terminal contact is part of a bent leadframe, onto which a sensor chip is bonded.

According to an exemplary embodiment of the connector, the connector is electrically connected to a cable. In particular, the cable may be part of a cable harness.

According to an exemplary embodiment of the method, the encapsulatiing is performed by an injection modling process.

Alternatively, the encapsulating may be carried out by a 3-D printing process.

According to an exemplary embodiment, the method further comprises placing a chip on the conductive structure before it is partially encapsulated.

In the drawings, the same reference signs generally refer to the same parts in the different views. The drawings are not necessarily to scale; instead, the general emphasis is on illustrating the principles of the invention. In the following description, various exemplary embodiments of the invention are described with reference to the following drawings.

The following detailed description refers to the accompanying drawings, which illustrate specific details and exemplary embodiments in which the invention may be realized.

The word "exemplary" is used here to mean "as an example, case, or illustration." Any exemplary embodiment or any design that will be used here as "exemplary" is not necessarily to be interpreted as being preferred or advantageous over other exemplary embodiments or designs.

Figure 1A:
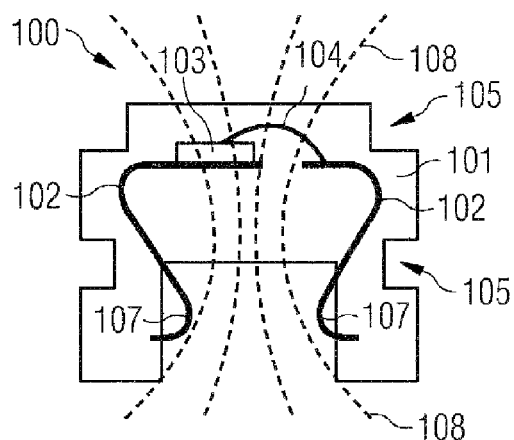
FIGS. 1A to 1F illustrate various exemplary embodiments of a magnet package.

FIG. 1A illustrates an exemplary embodiment of a magnet package, which is designed as a connector or a plug contact. The magnet package 100 comprises an encapsulation or housing 101, which is arranged around a bent leadframe 102 and/or partially covers the same. A sensor chip 103 is arranged on the leadframe 102 within the encapsulation 101 and is electrically connected or in contact with this leadframe by bonding wires 104. At the outside of the magnet package 100 structures 105 are formed, which may help in alignment and can also be used to insert sealing elements, e.g. sealing rings. The encapsulation is formed of a permanent magnetic material and forms a permanent magnet, which, together with the sensor chip 103, may form a part or portion of a sensor. Schematic field lines 108 are indicated to illustrate the magnetic field.

The leadframe 101 is not completely encapsulated, in order to allow use of the exposed sections 107 as electric contacts, with which a connector can be plugged into a socket or an electrical contact can be established.

Figure 1B:
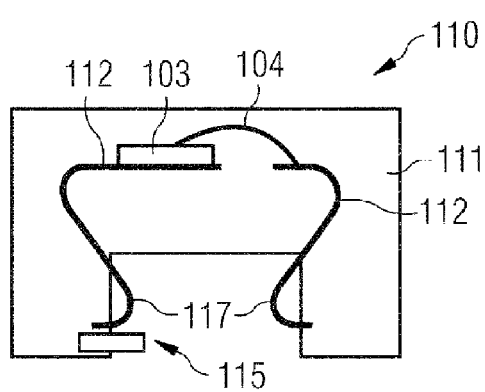

FIG. 1B illustrates another exemplary embodiment of a magnet package 110, which is similar to that shown in FIG. 1A. However, in the exemplary embodiment of FIG. 1B, an alignment structure 115 is not formed on an outside of the magnet package 110 or the encapsulation 111, but is formed as a single notch 115 near the exposed sections 117 of the leadframe 112.

Figure 1C:
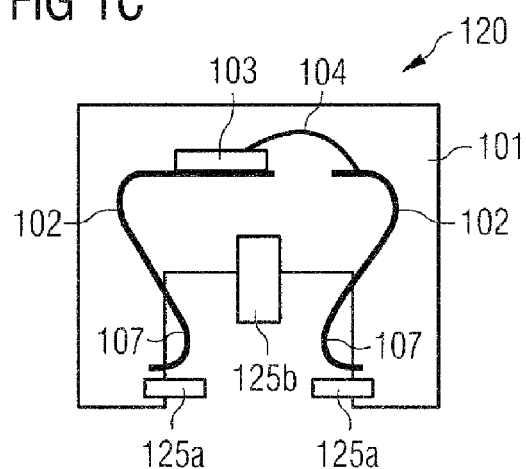

FIG. 1C illustrates another exemplary embodiment of a magnet package 120, which is similar to the one shown in FIG. 1B. However, a plurality of surface structures are formed in the exemplary embodiment of FIG. 1C. For example, a circumferential notch or a circumferential projection 125a, which can act as a thread, and a single projection 125b are formed, which can act as an alignment structure.

Figure 1D:
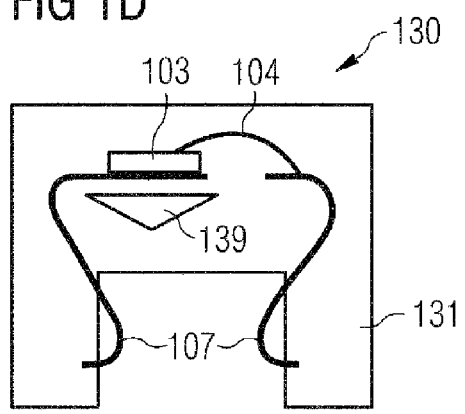
Figure 1E:
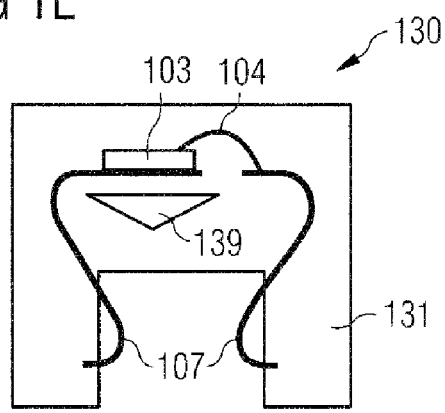

FIGS. 1D and 1E illustrate other exemplary embodiments of a magnet package 130 which are similar to that shown in FIG. 1A. However, a field-shaping region 139 is formed in the magnet package 130 of FIGS. 1D and 1E, which serves for shaping a magnetic field of the magnet package 130. In the exemplary embodiment of FIG. 1D, this field-shaping region is formed as a cavity or void, whereas in the exemplary embodiment of FIG. 1E, it is formed by a filled cavity in the encapsulation 131. For example, the cavity may be filled by a non-magnetic material. The field-shaping region can be formed in any desired shape.

Figure 1F:
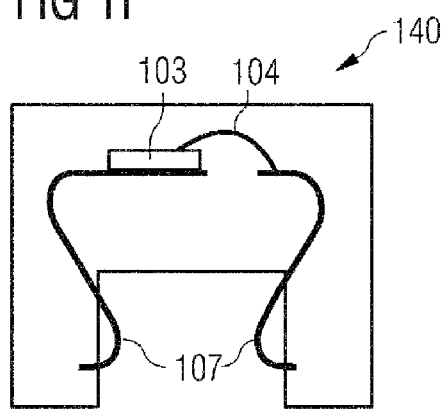

FIG. 1F illustrates another exemplary embodiment of a magnet package 140, which is similar to that shown in FIG. 1B. However, firstly it does not comprise any surface structure. Secondly, a gradient is formed inside the permanent magnetic material. In particular, the concentration of a magnetic component varies within a carrier component of the encapsulating material, as illustrated in FIG. 1F by differently dense crosshatching. The variation may be formed here continuously or stepwise, depending on what course a magnetic field should assume.

It should be noted that the permanent magnetic material may be a mixture of a carrier component, for example a thermoplastic or thermoset material, and a magnetic component. Here, magnetic component may describe, in particular, a material which is or can be permanently magnetized.

Figure 2:
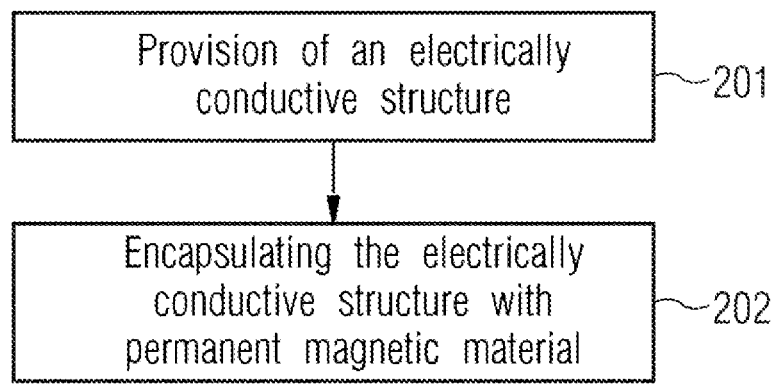
FIG. 2 is a flowchart of a method of manufacturing a magnet package.

FIG. 2 is a flowchart for a method of manufacturing a magnet package. In particular, the method comprises a providing of at least one electrically conductive structure (step 201). Such a conductive structure may be formed, for example, by a carrier or a leadframe. In particular, the conductive structure can be bent or formed to a shape, which is adapted to subsequent use of the magnet package. For example, a leadframe may be bent to a substantially U-shaped or V-shaped form, so that ends of the leadframe may form the contact areas of a connector. For this purpose, the leadframe may be formed of a mechanically stable but flexible and elastic material such as steel, iron, or copper.

Optionally, electronic components such as a chip, which may later form part of a sensor, can also be bonded onto this electrically conductive structure, for example. Preferably, the chip is electrically conductively coupled with the electrically conductive structure.

Subsequently, the electrically conductive structure is partially encapsulated by a permanent magnetic material (step 202). For example, the encapsulation may be formed by an injection molding or 3-D printing process. The encapsulation may form a housing, which on the one side protects the electrically conductive structure and an optional sensor and on the other side provides for electrical insulation in case the permanent magnetic material is non-conductive. In particular, the permanent magnetic material may be a mixture of a carrier component, such as an injection-moldable thermoplastic or thermoset and a magnetic component, such as a rare earth material, Sm, Co, Nd, Fe, ferrite, hard ferrite or a similar permanent magnetic material. The magnetic component may here be distributed in the carrier component in flake or particulate form. In specific exemplary embodiments, the proportion of the magnetic component in the encapsulation material may vary depending on the location within the magnet package, so that the proportion or the concentration of the magnetic component has a concentration gradient within the magnet package. In this way, the magnetic field generated by the magnetic component may be adjusted and set. Magnetic field-shaping areas may be provided for targeted shaping of the magnetic field, for example by holes or cavities (voids) in the magnet package or cavities filled with a different material in the magnet package, in particular, in the encapsulation.

It should be noted that the magnet package may have any desired shape, for example cuboid, cubic, cylindrical, etc. In particular, alignment structures or features, such as grooves, springs, notches, rills, or similar may be provided during the formation of the encapsulation. Threads simultaneously forming a permanent magnet and possessing a magnetic field because of the permanent magnetic material used may also be formed in the encapsulation.

While the invention has been particularly illustrated and described with reference to specific exemplary embodiments, the skilled person understands that various changes in terms of form and detail may be made, without departing from the spirit and scope of the invention as defined by the appended claims. Thus, the scope of protection of the invention is indicated by the appended claims, and all changes which come within the meaning and range of equivalency of the claims are to be included.

The invention claimed is:

1. Magnet package, comprising:
    a package body, wherein the package body is formed from a permanent magnetic material, and
    at least one electric contact, which is covered by the package body
wherein the electric contact is formed by a leadframe, wherein the electric contact is part of bent leadframe, and wherein the magnetic material comprises a carrier component and a magnetic component.

2. Magnet package according to claim 1, wherein the package is formed as a connector.

3. Magnet package according to claim 1, wherein the package body comprises at least one surface structure, which is suitable for use as an alignment feature.

4. Magnet package according to claim 1, wherein a magnetic field-shaping region is formed in the package body.

5. Magnet package according to claim 4, wherein the magnetic field-shaping region is formed by a cavity and/or another material.

6. Magnet package according to claim 1, wherein the magnet package further comprises a chip.

7. Magnet package according to claim 1, wherein the magnetic component comprises at least one substance, which is selected from the group of substances consisting of:
    samarium,
    cobalt,
    iron,
    neodymium,
    SmCo,
    NdFeB,
    ferrite,
    hard ferrite, and
    compounds thereof.

8. Magnet package according to claim 1, wherein the carrier component is a substance which is selected from the group consisting of:
- thermoplastics,
- thermosets,
- elastomers.

9. Magnet package according to claim 1, wherein the magnetic material is configured such that a magnetic field strength within the package body has a gradient.

10. Magnet package according to claim 1, wherein at least one electric contact is mechanically stable.

11. Connector, comprising
- a housing element comprising a permanent magnetic material; and
- at least one electrically conductive terminal, which is at least partially encapsulated by the housing element, wherein the electrically conductive terminal is part of a bent leadframe, and
wherein the magnetic material comprises a carrier component and a magnetic component.

12. Connector according to claim 11, wherein the housing element is selected by a process selected from the group consisting of the following processes:
- casting,
- injection molding, and
- 3-D printing.

13. Connector according to claim 11, wherein on the leadframe a sensor chip is bonded.

14. Connector according to claim 11, wherein the connector is electrically connected to a cable.

15. Method of manufacturing a magnet package, wherein the method comprises:
- providing at least one electrically conductive structure in form of a leadframe;
- bending of the leadframe, such that ends of the leadframe form an electrical contact;
- subsequently partially encapsulating the electrically conductive structure by a permanent magnetic material, wherein the magnetic material comprises a carrier component and a magnetic component.

16. Method according to claim 15, wherein the encapsulating is performed by an injection molding process.

17. Method according to claim 15, further comprising:
- placing a chip on the conductive structure before it is partially encapsulated.

* * * * *